(12) United States Patent
Furukawa et al.

(10) Patent No.: US 7,135,773 B2
(45) Date of Patent: Nov. 14, 2006

(54) INTEGRATED CIRCUIT CHIP UTILIZING CARBON NANOTUBE COMPOSITE INTERCONNECTION VIAS

(75) Inventors: Toshiharu Furukawa, Essex Junction, VT (US); Mark Charles Hakey, Fairfax, VT (US); David Vaclav Horak, Essex Junction, VT (US); Charles William Koburger, III, Delmar, NY (US); Mark Eliot Masters, Essex Junction, VT (US); Peter H. Mitchell, Jericho, VT (US); Stanislav Polonsky, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/787,640

(22) Filed: Feb. 26, 2004

(65) Prior Publication Data
US 2005/0189655 A1    Sep. 1, 2005

(51) Int. Cl.
*H01L 23/48* (2006.01)
*H01L 23/52* (2006.01)
*H01L 29/40* (2006.01)

(52) U.S. Cl. .................. 257/758; 257/762; 257/766; 257/E51.04; 977/742; 977/842

(58) Field of Classification Search ............. 257/758, 257/762, 766, E51.04; 977/742, 842
See application file for complete search history.

(56) References Cited

U.S. PATENT DOCUMENTS

| | | | |
|---|---|---|---|
| 2002/0163079 A1 | 11/2002 | Awano | |
| 2003/0179559 A1* | 9/2003 | Engelhardt et al. | 361/780 |
| 2003/0211724 A1* | 11/2003 | Haase | 438/629 |
| 2004/0152240 A1* | 8/2004 | Dangelo | 438/122 |
| 2005/0026411 A1* | 2/2005 | Tanamoto et al. | 438/597 |
| 2005/0048697 A1* | 3/2005 | Uang et al. | 438/108 |

OTHER PUBLICATIONS

L. Kalaugher, "Infineon forges ahead with nanotube applications" (Published on World Wide Web at nanotechweb.org Dec. 2002).
Z.F. Ren, et al., "Large Arrays of Well-Aligned Carbon Nanotubes", Proceedings of 13th Int'l Winter School on Electronic Properties of Novel Materials, pp. 263-267 (Feb. 27-Mar. 6, 1999).
B. Zheng, et al., "Efficient CVD Growth of Single-Walled Carbon Nanotubes on Surfaces Using Carbon Monoxide Precursor", Nano Letters, American Chemical Society (Manuscript dated Jun. 26, 2002).
J. Li, et al., "Bottom-up approach for carbon nanotube interconnects", Applied Physics Letters (vol. 82, No. 15, Apr. 14, 2003) Abstract Only.
J. Senkevich, "The Atomic Layer Deposition of Palladium via β-diketonates", (Published on the World Wide Web, Apr. 2003) Abstract Only.

(Continued)

*Primary Examiner*—Ngân V. Ngô
(74) *Attorney, Agent, or Firm*—Roy W. Truelson

(57) ABSTRACT

Conductive paths in an integrated circuit are formed using multiple undifferentiated carbon nanotubes embedded in a conductive metal, which is preferably copper. Preferably, conductive paths include vias running between conductive layers. Preferably, composite vias are formed by forming a metal catalyst pad on a conductor at the via site, depositing and etching a dielectric layer to form a cavity, growing substantially parallel carbon nanotubes on the catalyst in the cavity, and filling the remaining voids in the cavity with copper. The next conductive layer is then formed over the via hole.

17 Claims, 12 Drawing Sheets

OTHER PUBLICATIONS

Wolfgang Hoenlein, "New Prospects for Microelectronics: Carbon Nanotubes," Japanese Journal of Applied Physics; vol. 41, No. 6B, Part 1; Tokyo, Japan; Jun. 2002; XP001163432; ISSN 0021-4922; pp. 4370-4374.

Yuji Awano et al., "Carbon Nanotube Technologies for Future ULSIs," VLSI Technology, Systems, and Applications; IEEE; Piscataway, NJ; 2003 International Symposium; Oct. 2003; XP010675913; ISBN 0-7803-7765-6; pp. 40-41.

* cited by examiner

INTEGRATED CIRCUIT CHIP UTILIZING CARBON NANOTUBE COMPOSITE INTERCONNECTION VIAS

FIELD OF THE INVENTION

The present invention relates to digital data processing, and in particular to the design integrated circuit chips used as components of digital data systems.

BACKGROUND OF THE INVENTION

In the latter half of the twentieth century, there began a phenomenon known as the information revolution. While the information revolution is a historical development broader in scope than any one event or machine, no single device has come to represent the information revolution more than the digital electronic computer. The development of computer systems has surely been a revolution. Each year, computer systems become faster, store more data, and provide more applications to their users.

A modem computer system typically comprises a central processing unit (CPU) and supporting hardware necessary to store, retrieve and transfer information, such as communications buses and memory. It also includes hardware necessary to communicate with the outside world, such as input/output controllers or storage controllers, and devices attached thereto such as keyboards, monitors, tape drives, disk drives, communication lines coupled to a network, etc. The CPU is the heart of the system. It executes the instructions which comprise a computer program and directs the operation of the other system components.

From the standpoint of the computer's hardware, most systems operate in fundamentally the same manner. Processors are capable of performing a limited set of very simple operations, such as arithmetic, logical comparisons, and movement of data from one location to another. But each operation is performed very quickly. Programs which direct a computer to perform massive numbers of these simple operations give the illusion that the computer is doing something sophisticated. What is perceived by the user as a new or improved capability of a computer system is made possible by performing essentially the same set of very simple operations, but doing it much faster. Therefore continuing improvements to computer systems require that these systems be made ever faster.

The overall speed of a computer system (also called the throughput) may be crudely measured as the number of operations performed per unit of time. There are numerous ways in which system speed might be improved, but conceptually the simplest and most fundamental of all improvements is to increase the speed at which the basic circuits operate, i.e., to increase the clock speeds of the various components, and particularly the clock speed of the processor(s). E.g., if everything runs twice as fast but otherwise works in exactly the same manner, the system will perform a given task in half the time.

Clock speeds are necessarily limited by various design parameters, and in particular are limited by signal propagation delays. In general, clock speeds can be increased if the length of signal paths is reduced, i.e., by shrinking the size of the logic elements. Early computer processors, which were constructed from many discrete components, were susceptible to significant speed improvements by shrinking component size, reducing discrete component numbers, and eventually, packaging the entire processor as an integrated circuit on a single chip. Modem processor chip designs often include one or more caches on the same integrated circuit chip as the processor, and in some cases include multiple processors on a single integrated circuit chip.

Despite the enormous improvement in speed obtained from integrated circuitry, the demand for ever faster computer systems has continued. With this demand comes a need for even further size reduction in the logic circuitry within an integrated circuit chip.

A typical integrated circuit chip is constructed in multiple layers. Many active and passive elements are formed on a substrate (usually silicon). A dielectric layer is placed over the active elements, and multiple conductive layers, each separated by another dielectric layer, are formed over the active elements. The conductive layers carry power and ground potentials, as well as numerous signal interconnects running among active elements. Conductive interconnects between conductive layers, or between a conductive layer and an active or passive element, are formed as holes in the dielectric layers, called vias, into which a conductive metal, such as aluminum or copper, is introduced.

The number of active elements in a typical processor dictates a very large number of interconnections, and since these must be packaged within a small area, the size of individual interconnections is limited. Vias, being just metallic conductors, have a small, finite resistance, which grows as the cross-sectional area of the via shrinks. Increasing the number of logic elements on a chip requires a larger number of vias, which in turn reduces the amount of space available for each individual via. If all other design parameters remain the same, this has the effect of increasing the resistances of the individual vias. A need exists for improved design techniques for forming interconnection conductors, and in particular conductive vias, which will support reduced size of interconnects and greater circuit element density.

Recently, it has been suggested that carbon nanotubes might be used to form conductive pathways in integrated circuits. Carbon nanotubes are pure carbon molecular structures in which a graphite-like structural layer of covalently bonded carbon atoms is wrapped around into a cylindrical shape. Such a structure has a diameter in the nanometer range, and is potentially orders of magnitude longer in the axial dimension. Some carbon nanotubes have extremely high electrical conductivity up to a current limit. The conductivity of these carbon nanotubes is significantly higher (by some estimates, an order of magnitude higher) than that of ordinary metals. Additionally, the current capacity of carbon nanotubes is higher than metals, so that use of nanotubes as conductors can be expected to improve the long-term stability of the form and electrical resistance of the structure.

While the high conductivity of certain carbon nanotubes suggests possible application in electronic circuits, there are significant engineering hurdles involved in design and commercial production of a successful device using carbon nanotubes.

SUMMARY OF THE INVENTION

Conductive paths in an integrated circuit are formed using multiple undifferentiated carbon nanotubes embedded in a conductive metallic material. Preferably, conductive paths include vias running between conductive layers, and the nanotubes are embedded in a conductive metal such as copper or aluminum, although other metals might be used or other conductive paths formed.

In the preferred embodiment, a metal catalyst pad is formed on a conductor at the location of a future via. A dielectric layer is then deposited over the layer containing the conductor and catalyst, and a hole is formed in the dielectric at the location of the via. Substantially parallel carbon nanotubes are then grown within the hole from the catalyst, up to the top of the dielectric layer. The hole containing the carbon nanotubes is then filled with a conductive metal to produce a composite carbon nanotube—metal via. The next conductive layer is then formed over the via hole.

The use of metal filling in the voids between carbon nanotubes, in accordance with the preferred embodiment, resolves several potential problems in construction of practical carbon nanotube conduction devices. Although carbon nanotubes have a potentially high conductivity, the small cross sectional area of the tube makes electrical coupling at the tube interface difficult. By filling the voids in the via with copper or another metal, a large contact area is established between the metal and the carbon nanotubes, improving the conductive interface. It has further been observed that carbon nanotubes are difficult to produce in pure form, and that most established techniques produce a mixture of conductive and semi-conductive carbon nanotubes. Where the voids between multiple carbon nanotubes in a via are filled with metal, the presence of some proportion of semi-conductive tubes will not appreciably affect the characteristics of the integrated circuit as a whole.

In alternative embodiments, discontinuities are created in the catalyst area to increase the spacing between carbon nanotubes. The increased size of the voids between carbon nanotubes may facilitate the metal fill process, which otherwise may have difficulty completely filling the voids.

The details of the present invention, both as to its structure and operation, can best be understood in reference to the accompanying drawings, in which like reference numerals refer to like parts, and in which:

DETAILED DESCRIPTION OF THE PREFERRED EMBODIMENTS

Figure 1:
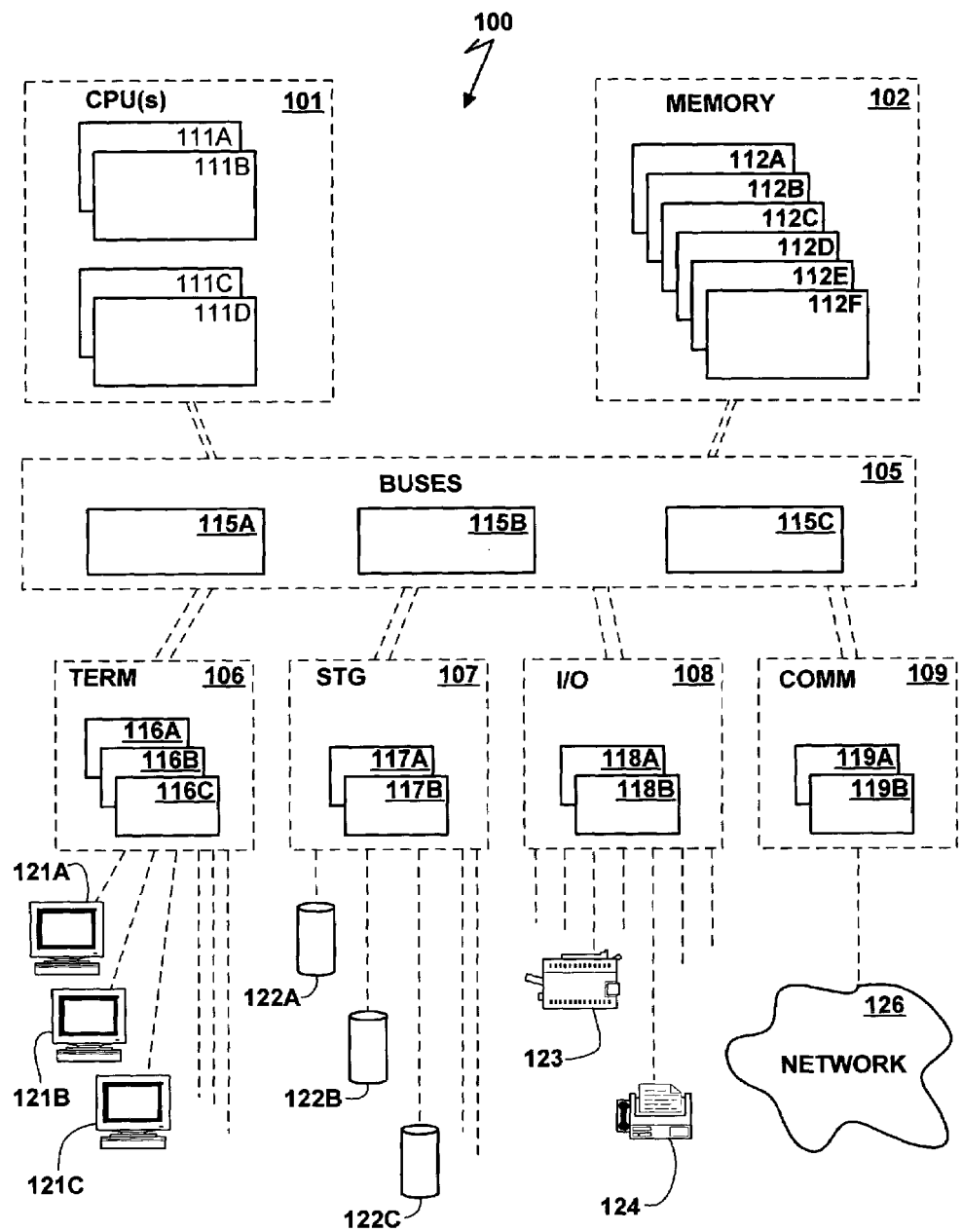
FIG. 1 is a high-level block diagram of the major hardware components of a computer system for utilizing integrated circuits having carbon nanotube conductors, according to the preferred embodiment of the present invention.

Referring to the Drawing, wherein like numbers denote like parts throughout the several views, FIG. 1 is a high-level representation of the major hardware components of a computer system 100 for utilizing integrated circuits having carbon nanotube conductors, according to the preferred embodiment of the present invention. At a functional level, the major components of system 100 are shown in FIG. 1 outlined in dashed lines; these components include one or more central processing units (CPU) 101, main memory 102, terminal interface 106, storage interface 107, I/O device interface 108, and communications/network interfaces 109, all of which are coupled for inter-component communication via one or more buses 105.

CPU 101 is one or more general-purpose programmable processors, executing instructions stored in memory 102; system 100 may contain either a single CPU or multiple CPUs, either alternative being collectively represented by feature CPU 101 in FIG. 1, and may include one or more levels of on-board cache (not shown). Memory 102 is a random-access semiconductor memory for storing data and programs. Memory 102 is conceptually a single monolithic entity, it being understood that memory is often arranged in a hierarchy of caches and other memory devices. Additionally, memory 102 may be divided into portions associated with particular CPUs or sets of CPUs and particular buses, as in any of various so-called non-uniform memory access (NUMA) computer system architectures.

Terminal interface 106 provides a connection for the attachment of one or more user terminals 121A–C (referred to generally as 121), and may be implemented in a variety of ways. Many large server computer systems (mainframes) support the direct attachment of multiple terminals through terminal interface I/O processors, usually on one or more electronic circuit cards. Alternatively, interface 106 may provide a connection to a local area network to which terminals 121 are attached. Various other alternatives are possible. Data storage interface 107 provides an interface to one or more data storage devices 122A–C, (referred to generally as 122), which are typically rotating magnetic hard disk drive units, although other types of data storage device could be used. I/O and other device interface 108 provides an interface to any of various other input/output devices or devices of other types. Two such devices, printer 123 and fax machine 124, are shown in the exemplary embodiment of FIG. 1, it being understood that many other such devices may exist, which may be of differing types. Communications interface 109 provides one or more communications paths from system 100 to other digital devices and computer systems; such paths may include, e.g., one or more networks 126 such as the Internet, local area networks, or other networks, or may include remote device communication lines, wireless connections, and so forth.

Buses 105 provide communication paths among the various system components. Although a single conceptual bus entity 105 is represented in FIG. 1, it will be understood that a typical computer system may have multiple buses, often arranged in a complex topology, such as point-to-point links in hierarchical, star or web configurations, multiple hierarchical busses, parallel and redundant paths, etc., and that separate buses may exist for communicating certain information, such as addresses or status information.

Physically, the major functional units are typically embodied in one or more integrated circuit chips. Such chips are generally mounted on electronic circuit card assemblies, with multiple chips often mounted on a single circuit card. In FIG. 1, CPU 101 is represented as containing four integrated circuit chips 111A–D, each of which may contain one or more processors, or may perform only part of the functions of a single processor; memory 102 is represented as containing six chips 112A–112F, buses 105 as containing three chips 115A–C, terminal interface 106 as containing three chips 116A–116C, storage interface 107 as containing two chips 117A–B, I/O and other interface 108 as containing two chips 118A–B, and communications interface 109 as containing two chips 119A–B. However, the actual number of such chips may vary.

It should be understood that FIG. 1 is intended to depict the representative major components of an exemplary system 100 at a high level, that individual components may have greater complexity than represented FIG. 1, and that the number, type and configuration of such functional units and physical units may vary considerably. It will further be understood that not all components shown in FIG. 1 may be present in a particular computer system, and that other components in addition to those shown may be present. Although system 100 is depicted as a multiple user system having multiple terminals, system 100 could alternatively be a single-user system, typically containing only a single user display and keyboard input, or might be a server or similar device which has little or no direct user interface, but receives requests from other computer systems (clients).

Figure 2:
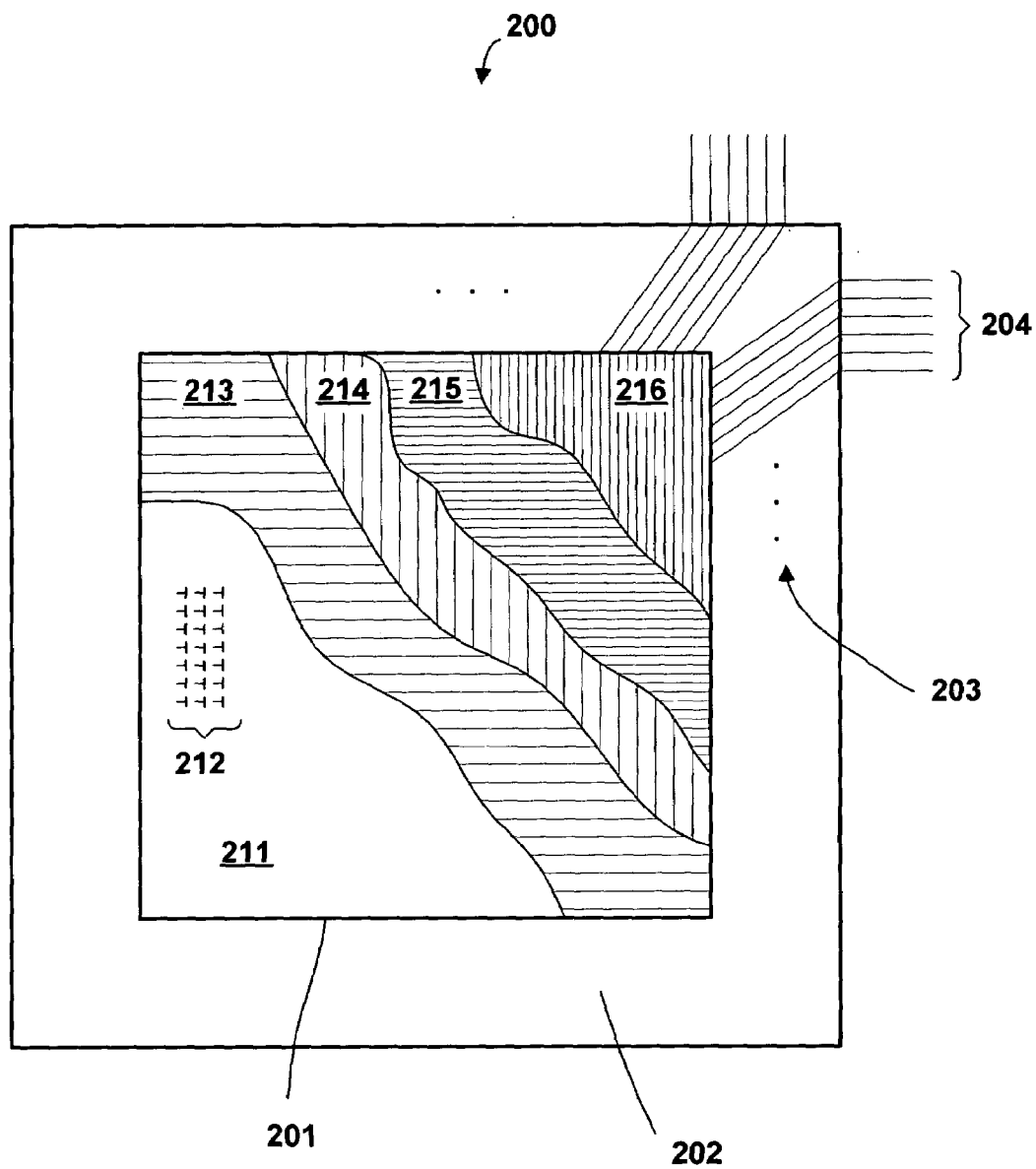
FIG. 2 is a simplified illustration of an integrated circuit module in cut-away, top view representation, according to the preferred embodiment.
Figure 3:
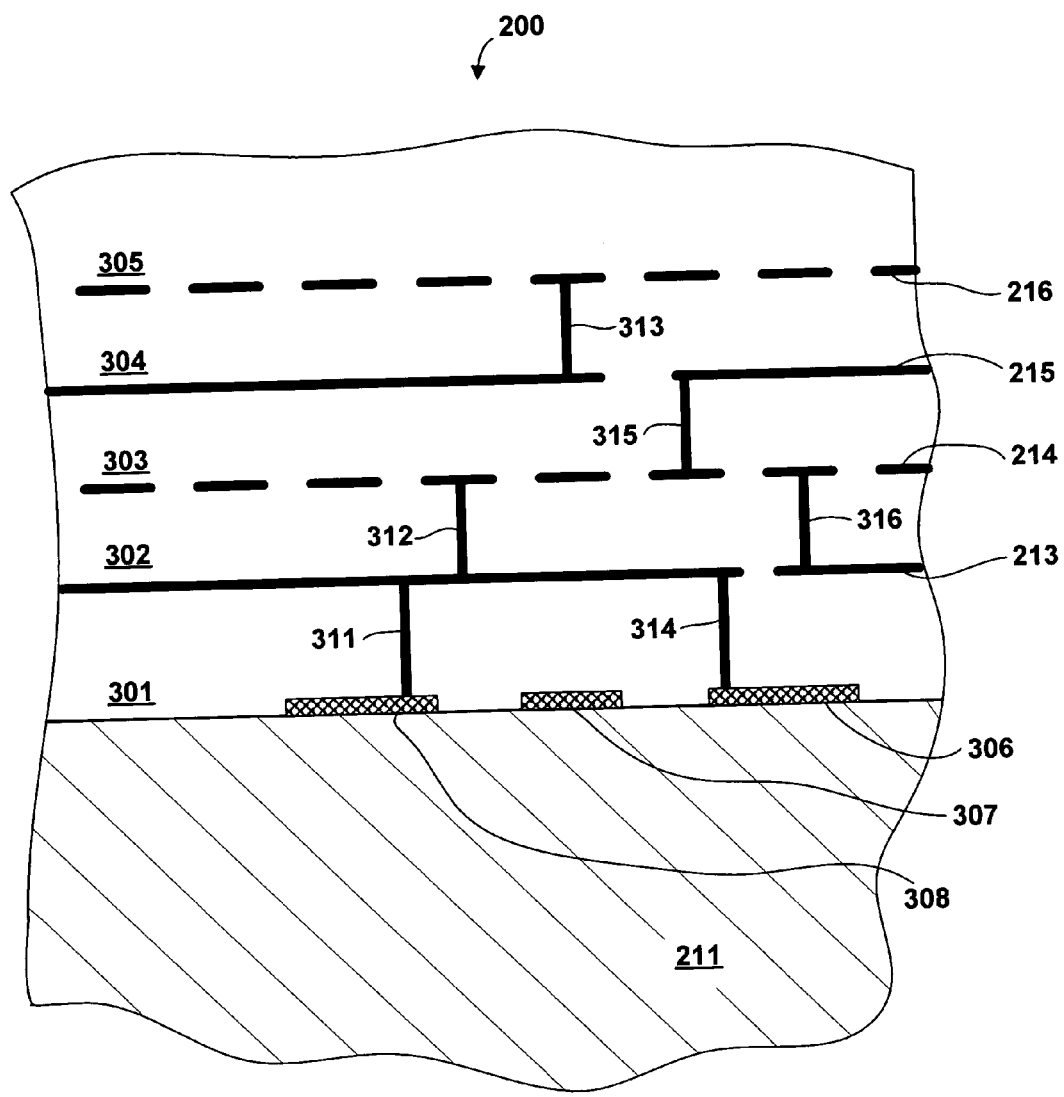
FIG. 3 is a simplified illustration of a portion of an integrated circuit module in cross-sectional view, according to the preferred embodiment.

FIG. 2 and FIG. 3 are simplified illustrations of an integrated circuit module 200, also called a "chip", according to the preferred embodiment. Integrated circuit module 200 is shown in FIG. 2 in a cut-away, top view representation. A portion of integrated circuit module 200 is shown in cross-section in FIG. 3 Integrated circuit module 200 represented in FIGS. 2 and 3 may be any of modules 111A–D, 112A–F, 115A–C, 116A–116C, 117A–B, 118–B, or 119A–B, or could be some other module not represented in FIG. 1. Integrated circuit module 200 contains a chip 201, i.e. various electronic circuits and elements formed on a single relatively broad, flat semiconductor substrate. The substrate and electronics integrally formed thereon (chip) is surrounded by and encapsulated in a protective insulator 202. The entire assembly is typically mounted on an electronic circuit card (not shown) having multiple conductive paths for connecting the module to other components of a digital device. Such a card often has multiple integrated circuit modules mounted thereon. Multiple conductive lines 203 emanate from the substrate chip and connect to I/O pins 204 which extend from module 200. I/O pins 204 are coupled to the conductive paths in the electronic circuit card. Although the I/O pins are shown in FIG. 2 along the two edges of module 200 for illustrative purposes, they are often mounted along all four edges. Alternatively, I/O connections may be formed in various other ways, now known or hereafter developed; e.g., I/O connections can be formed in the bottom of the module, using pins, pads, or balls.

Chip 201 is a thin, flat member which is constructed in multiple layers. The bottom layer is a semiconductor substrate 211, which is typically silicon, although other materials, such as SiGe, SiC and GaAs, are possible. The semiconductor layer may optionally be deposited over one or more layers of a different material providing structural support or other function, such as sapphire. Multiple active and/or passive devices 212, such as field-effect transistors, are formed on the substrate by selective doping of the substrate, and deposition of additional insulator (dielectric) and conductive material. Logic circuits are created by connecting the various active and passive devices in a desired configuration, and providing power and ground connections to the active devices. Conductive interconnections between active devices are placed in multiple layers containing conductors 213–216, each layer being separated from adjacent layers by insulative layers 301–305.

Since the number of active devices and interconnections is typically very large, and the design of an integrated circuit typically requires interconnections in various directions, physical placement of interconnections is a challenging design issue. Generally, individual conductors within a conductive layer run in a single direction, the direction alternating at right angles with successive conductive layers. Conductive vias 311–316 penetrate the insulative layer or layers between conductive layers, to make electrical connections. A conductive via may run between two conductors in different conductive layers (as represented in FIG. 3 by vias 312, 313, 315 and 316), or between some part of an active or passive device 306–308 and a conductive layer (as represented in FIG. 3 by vias 311 and 314. A single conductive path may traverse several conductive layers and several vias.

It will be understood that FIGS. 2 and 3 are intended as a high-level representation of an integrated circuit module for illustrative purposes, and are not necessarily to scale. The actual number of active devices contained on a single chip module is so large and the size of an individual device so small as to be difficult or impossible to illustrate to scale in a single drawing. Furthermore, while four conductive layers are shown, the actual number of such layers may vary.

In order to support improved capabilities of computer systems and other digital devices, it is desirable to decrease the size of, and increase the number of, active and/or passive devices in an integrated circuit chip. Increasing the number of devices requires an increase in the number of conductive interconnections. Simply making all the conductors smaller and placing them closer together, without other design modifications, can result in increased resistance and capacitance of the conductors. Using conventional technology, it is difficult to achieve sufficient conductance of the interconnection conductors within the foreseeable space limitations of future integrated circuit designs. This is particularly true of the interconnection vias, which provide conductive connections from one layer to another.

In accordance with the preferred embodiment of the present invention, conductive vias in an integrated circuit are constructed of a composite of carbon nanotubes and a metal, such as copper. The carbon nanotubes are preferably grown in parallel in a via space, and the voids between the nanotubes are then filled with a metal, such as copper. Because carbon nanotubes have an extremely high conductivity and current carrying capacity, they can carry the bulk of the electrical current through the length of the via. However, carbon nanotubes are extremely narrow in cross section. While a via made purely of carbon nanotubes may have very high conductance through its length, the contact area at the interface with the next integrated circuit layer is so small that there may be significant resistance at the interface, counteracting the benefit of the carbon nanotube's high conductance. By filling the voids between the nanotubes with a metal such as copper, which is the same metal used for the conductors in the conductive layers, a large surface area is provided at the interface between the carbon nanotubes and the metal (e.g. copper). The carbon nanotubes are therefore grown in a spatial arrangement which facilitates subsequent deposition of the metal within the voids.

Two alternative processes for forming a carbon nanotube and copper composite via in accordance with the preferred embodiment will now be described, with reference to FIGS. 4A–4G, 5, 6A–6G and 7. FIG. 5 is a flow diagram showing the overall process steps for forming a composite via, according to a first preferred embodiment. FIGS. 4A–4G are simplified enlarged cross-sectional views of a portion of an integrated circuit chip, showing the construction of a carbon nanotube and copper composite via at various stages, in accordance with the first preferred embodiment. FIG. 7 is a flow diagram showing the overall process steps for forming a composite via, according to an alternative, or second preferred embodiment. FIGS. 6A–6G are simplified enlarged cross-sectional views of a portion of an integrated circuit chip, showing the construction of a carbon nanotube and metal composite via at various stages, in accordance with the alternative embodiment. It should be understood that FIGS. 4A–4G and FIGS. 6A–6G are not necessarily drawn to scale, and in particular, the size of carbon nanotubes has been exaggerated for illustrative purposes, and the number of such features correspondingly reduced. While the processes below are illustrated and described with respect to a single via for clarity, it will be understood that in a typical implementation, multiple vias will be constructed simultaneously.

As is known, integrated circuit chips are typically built up in layers from the substrate, successive layers being deposited according to any of various processes, sometimes selectively removed to create features, and eventually covered by other layers. In a first preferred embodiment, a "double damascene" process is used to deposit metal conductors. In a "double damascene" process, trenches and cavities are created in a dielectric, which are then filled with a metal conductor, the "double" referring to the fact that both the vias and the conductors in a planar layer are filled in a single step. This double damascene process is particularly preferred where the metal conductor is copper, because it easily accommodates the deposition of a barrier to copper migration on all copper surfaces. However, this process can be used with other metals as well.

Figure 4A:
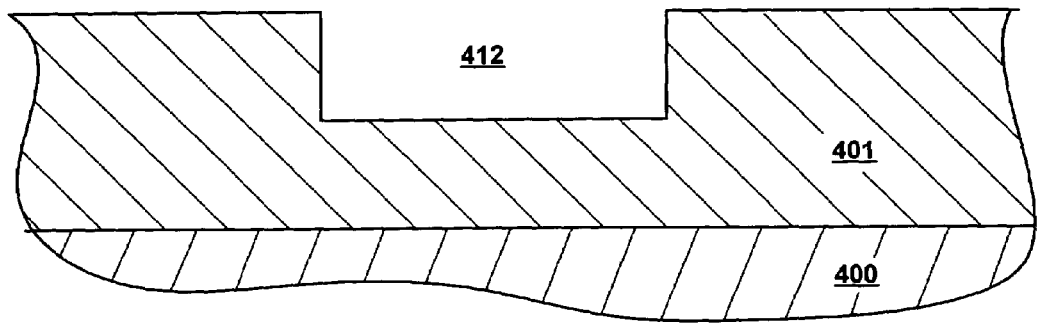
FIGS. 4A–4G are simplified enlarged cross-sectional views of a portion of an integrated circuit chip, showing the construction of a carbon nanotube and copper composite via at various stages, in accordance with a first preferred embodiment.
Figure 5:
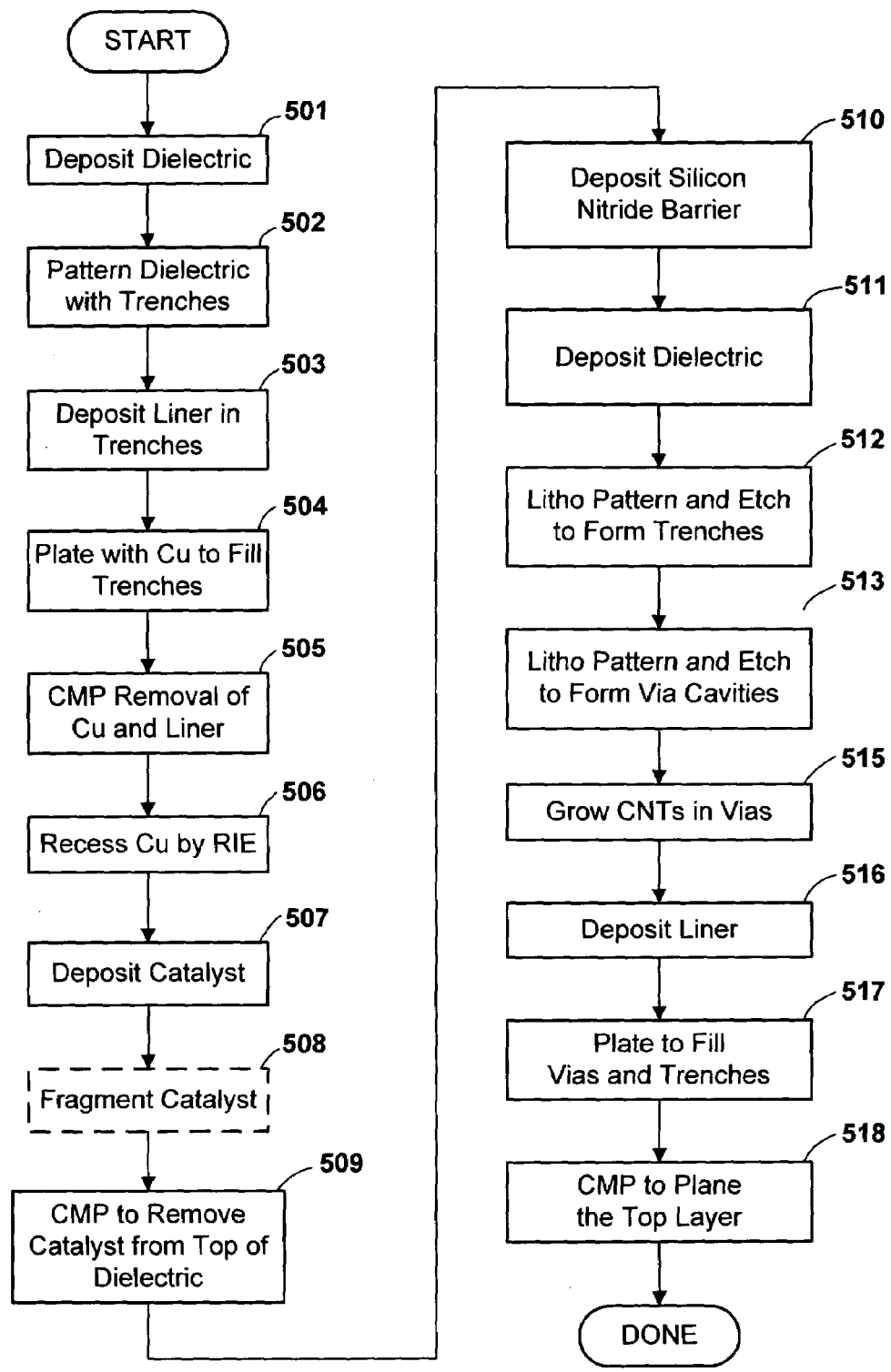
FIG. 5 is a flow diagram showing the overall process steps for forming a composite via, according to the first preferred embodiment.

The process of creating a carbon nanotube and copper composite via according to the first preferred embodiment begins from a dielectric layer 401, illustrated in FIG. 4A. Dielectric layer 401 is fabricated on top of another layer 400, which could be a layer of metal conductors, or could be the substrate itself. Layer 400 may be fabricated using any conventional technique, or any technique hereafter developed, or could be another metal layer fabricated as described herein. Dielectric layer 401 is formed by depositing a substantially uniform dielectric layer on lower layer 400, represented in FIG. 5 as step 501. Preferably, the dielectric layer is a fluorosilicate glass low-k dielectric, although other materials might alternatively be used. A pattern of trenches for conductors is then formed in the dielectric layer by lithographically patterning the top surface of the deposited dielectric with a photo-resist image, according to a pattern of desired conductors; removing a portion of the unmasked dielectric by reactive ion etch to create a pattern of trenches; and cleaning the photo-resist mask from the surface, collectively represented as step 502. FIG. 4A shows a resulting single trench 412 in cross section in dielectric layer 401, after performing step 502, it being understood that in fact dielectric layer 401 has a complex pattern of trenches.

A thin multiple-layer liner 402 is then deposited over the entire top surface of the dielectric 401, including in particular the trenches (step 503). The liner comprises a first layer of titanium nitride (TiN), followed by a second layer of Ti, followed by a third layer of copper. All three layers are deposited by atomic layer deposition and/or chemical vapor deposition (CVD) or physical vapor deposition (PVD) processes. The TiN/Ti layers act as a barrier to prevent copper migration into the dielectric and improve adhesion. Tantalum nitride (TaN) may alternatively be used in place of TiN as a barrier. The copper layer is a seed layer to improve adhesion and filling of the trenches with copper in the plating process to come.

Figure 4B:
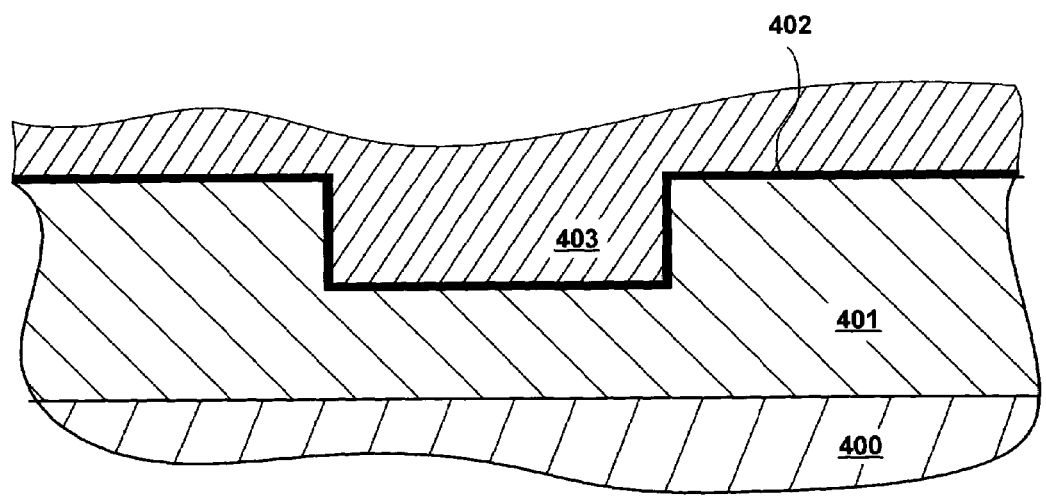

The entire top surface of the chip assembly is then plated with copper (step 504). The plating process leaves copper 403 completely filling the trenches and forming the future conductors, as well as a copper residual layer over the top of the dielectric 401 and liner 402. FIG. 4B shows a resulting trench in cross section, after the copper plating process.

The top surface of the resulting chip assembly is then subjected to a chemical-mechanical polish (CMP) to remove the copper residual layer a the trenches, i.e., the top surface is polished down to the top of the dielectric layer 401 (step 505). Polishing leaves the copper 403 filling the trenches level with the top of dielectric 401. The copper 403 is then recessed in the trenches by reactive ion etching (step 506). Preferably, an etching agent which is selective to copper is used, so that the copper is removed faster than the dielectric, leaving a shallow recess in the copper trenches.

A thin catalyst layer 404 is then deposited over the surface of the chip assembly (step 507). The catalyst is preferably nickel, iron or cobalt, which may be fragmented by dilution or otherwise, as described further herein. The catalyst is preferably deposited as layer over the entire surface using atomic layer deposition or chemical vapor deposition techniques.

It is known that nickel, iron or cobalt will catalyze the formation of carbon nanotubes under appropriate process conditions, and a maximum density of nanotubes can be expected by using pure catalyst. However, it may be desirable to deliberately retard carbon nanotube growth at maximum density, leaving larger voids between the tubes. The reason for this is that it facilitates the later deposition of copper into the via, helping to deposit the copper all the way to the bottom of the via. Therefore, in a preferred embodiment, the catalyst is "fragmented" by dilution with a non-reactive metal. Specifically, a metal composite of approximately 60% Ni and 40% Mo may be used to reduce carbon nanotube density in the via, it being understood that other metals and proportions may also be possible. Such a composite creates a non-uniform distribution of the catalytic metal, effectively "fragmenting" the catalyst into small areas of higher density for supporting spaced-apart carbon nanotube growth. As an alternative method of "fragmentation", the catalyst may in appropriate circumstances be subjected to an additional process step, represented as optional step 508. For example, the catalyst may be crystallized by heating, causing lumps of catalyst to form, with similar effect expected on carbon nanotube growth.

Figure 4C:
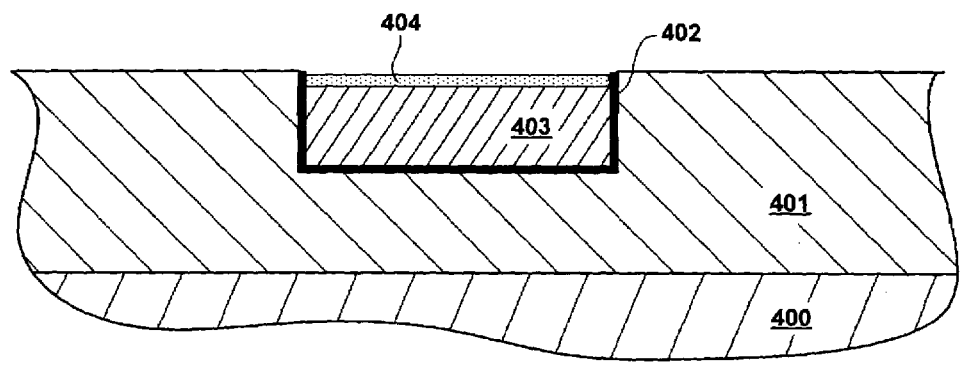

The surface is then subjected to a chemical-mechanical polish to remove the catalyst layer from the top surface of the dielectric 401, leaving catalyst 404 only in the shallow recesses where copper trenches are located (step 509). FIG. 4C is an idealized depiction of the surface after polishing step 509.

In preparation for the next dielectric layer, a barrier layer of Silicon Nitride ($Si_3N_4$) 405 is then deposited over the polished surface (step 510). Like Titanium Nitride, Silicon Nitride acts as a barrier to the migration of copper unto the dielectric. However, unlike Titanium Nitride, Silicon Nitride is itself a dielectric material, and therefore there need be no concern if the silicon nitride barrier bridges multiple conductors in the conductive layer.

Figure 4D:
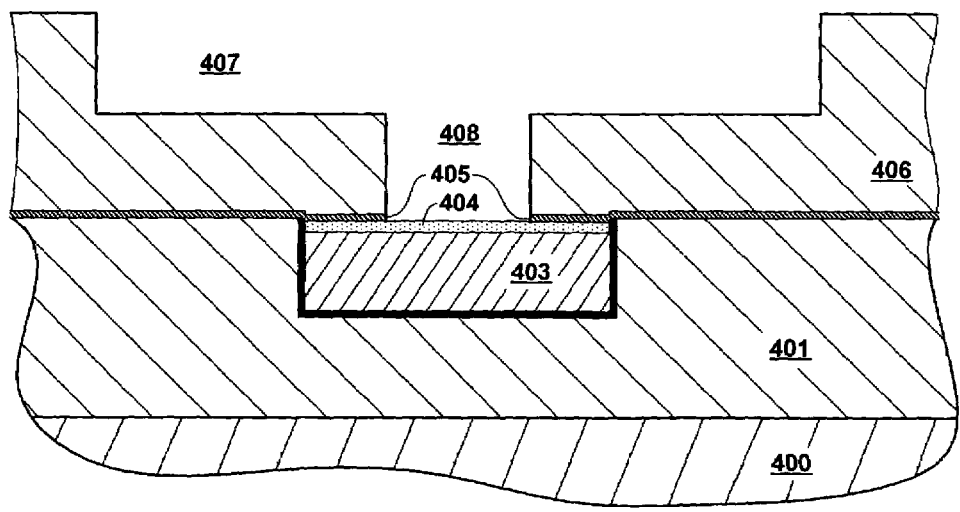

A second dielectric layer 406 having trenches 407 and via cavities 408 therein is then formed immediately over the top surface of the chip assembly, as represented in FIG. 4D. The cavity can be formed according to any conventional process for forming a dielectric layer with a cavity therein, including any process hereafter developed. Preferably, the cavity is formed in a multi-stage process, in which the dielectric layer 406 is first deposited over the entire surface of the underlying chip assembly (step 511). The dielectric layer so deposited is then patterned lithographically using a suitable photo-resist, and the unmasked portions of the dielectric layer are then partially removed by reactive ion etching to form trenches 407 (step 512), according to the lithographic pattern, the trenches corresponding to future metallic conductors in the next conductive layer. Before filling the trenches with metal, the dielectric is again patterned lithographically using a suitable photo-resist, the second pattern corresponding to future vias running between conductive layers, and the unmasked dielectric and underlying barrier layer at the via locations is removed by reactive ion etching to form via cavities 408, the via cavities running all the way through dielectric 406 and barrier layer 405 to catalyst 404 (step 513). The photo-resist is then removed from the remaining dielectric layer. It will be understood that a large number of trenches and via cavities (not shown in FIG. 4D) in the dielectric are formed simultaneously by this process. Preferably, the lithographic mask has holes for the vias approximately 200 nm square, which produces a round via hole approximately 200 nm in diameter. Via holes may be printed on a pitch of 400 nm or greater. Preferably, the etching agent is selective to the dielectric and does not affect the liner. FIG. 4D represents a portion of the chip assembly after performing step 513, showing a via cavity in cross section.

Figure 4E:
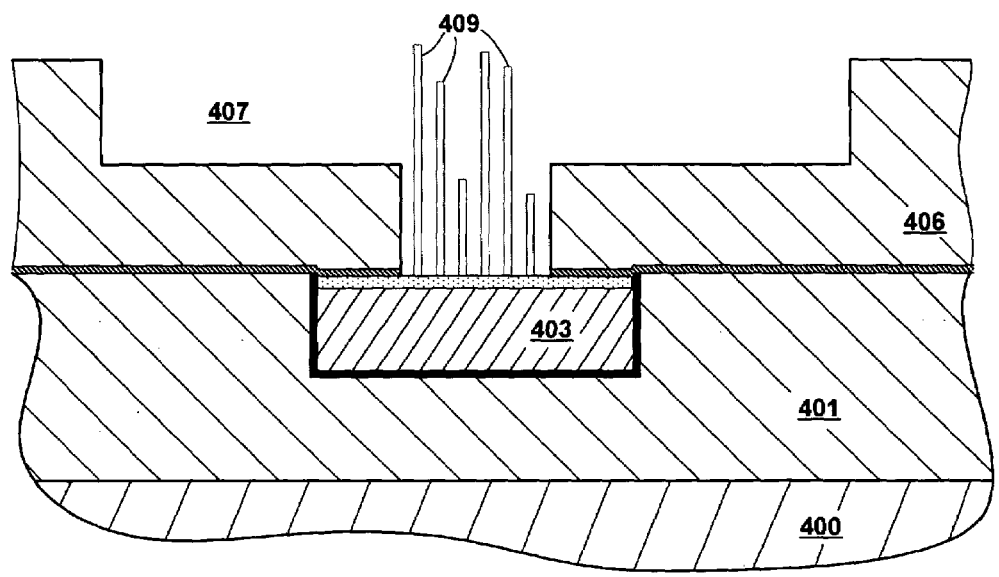

After the catalyst is exposed, carbon nanotubes 409 are grown in the via from the catalyst area (step 515). FIG. 4E represents the via after carbon nanotubes 409 have been grown therein. In the preferred embodiment, carbon nanotubes are grown from an acetylene gas source in the presence of an ammonia catalyst, at a temperature of approximately 500–600° C. The ratio of acetylene to ammonia can range from approximately 1:2 to 1:4. Reaction time can be approximately 1–10 minutes, and is preferably about 2–3 minutes. The ammonia can be introduced either prior to the acetylene, or in conjunction with the acetylene. CNT's may also be grown using various combinations of a carbon containing gas and a chemical cracking catalyst.

The process described herein generates a heterogenous collection of carbon nanotubes, which vary in diameter, length, and deposition density, as well as in other properties, particularly their electrical conductivity. Diameters vary from nanometers for single-walled carbon nanotubes to tens of nanometers for multi-walled carbon nanotubes. FIG. 4E is not intended to represent features to scale, or show a typical number of carbon nanotubes within a via, the actual number typically being larger than represented in FIG. 4E. As shown in FIG. 4E, some of the nanotubes will extend beyond the dielectric layer and out of the via cavity. Only some fraction of these nanotubes would be highly electrically conductive nanotubes (sometimes referred to as "metallic", not because they contain metals, but because their electrical conductivity approximates or exceeds that of metals). The "non-metallic" nanotubes have some, but significiantly less, electrical conductivity. For purposes of conducting electrical current through a via, only the "metallic" nanotubes are useful. Although the process described herein does not produce exclusively metallic nanotubes, the number of individual tubes in each via is sufficiently high to statistically assure that a sufficient number of metallic nanotubes should be produced in each via to provide high conductance in the via.

Figure 4F:
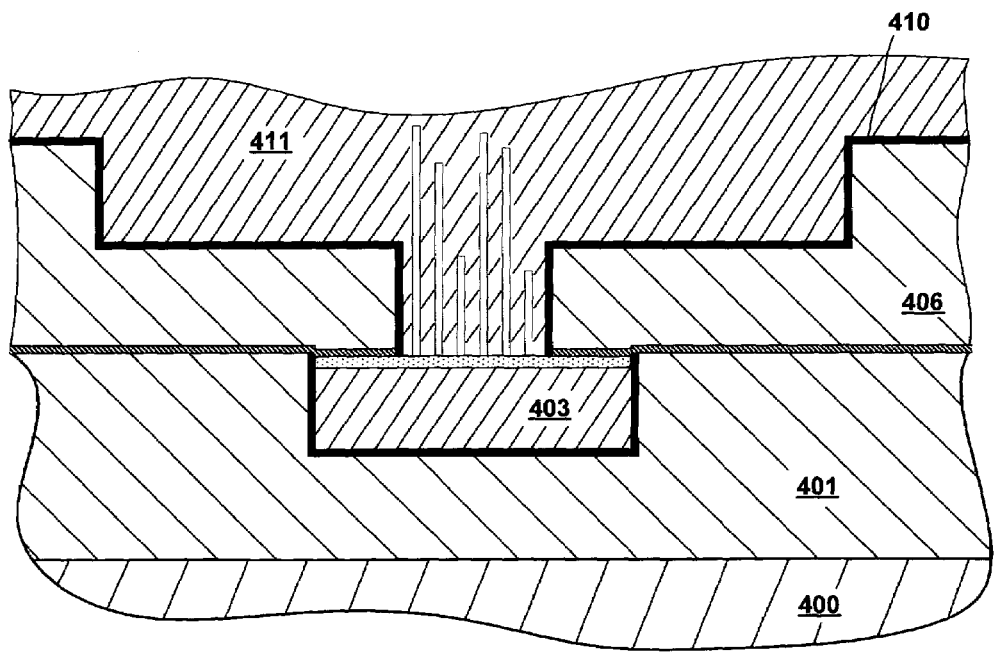

Carbon nanotubes are long, thin members which grow substantially parallel to one another in the via cavity. The carbon nanotubes do not fill the entire volume of the via cavity, but leave narrow spaces, herein referred to as voids, between the tubes. After the carbon nanotubes have been formed in the via cavity as described above, these voids between the carbon nanotubes are filled with copper. The vias are filled with copper at the same time that trenches 407 are filled. To fill the trenches and vias with copper, a thin liner 410, comprising a barrier and a seed layer, is first deposited over the entire exposed surface of the chip assembly, i.e., over the dielectric top surface, in the trenches, and in the via walls and bottom (step 516). The barrier is preferably deposited as two layers using atomic layer deposition, the first layer being TiN (or alternatively TaN), followed by a Ti layer. After the barrier is deposited, a seed layer of copper is deposited by atomic layer deposition or by chemical vapor deposition. The barrier layers act to prevent copper migration into the dielectric 404 at the via walls and trench walls. The seed layer provides a surface for subsequent deposition of copper by plating. After deposition of the liner 410, the via is filled with copper 411 by plating (step 517). Alternatively, the via may be filled by chemical vapor deposition or physical vapor deposition. FIG. 4F represents the via after a copper plating process which fills the voids in the via cavity, fills the trenches, and plates the top surface of the dielectric with a copper layer. It will be observed that, because some nanotubes extend out of the via cavity, the plating surface may be uneven, and exhibit bumps in the vicinity of the vias.

Figure 4G:
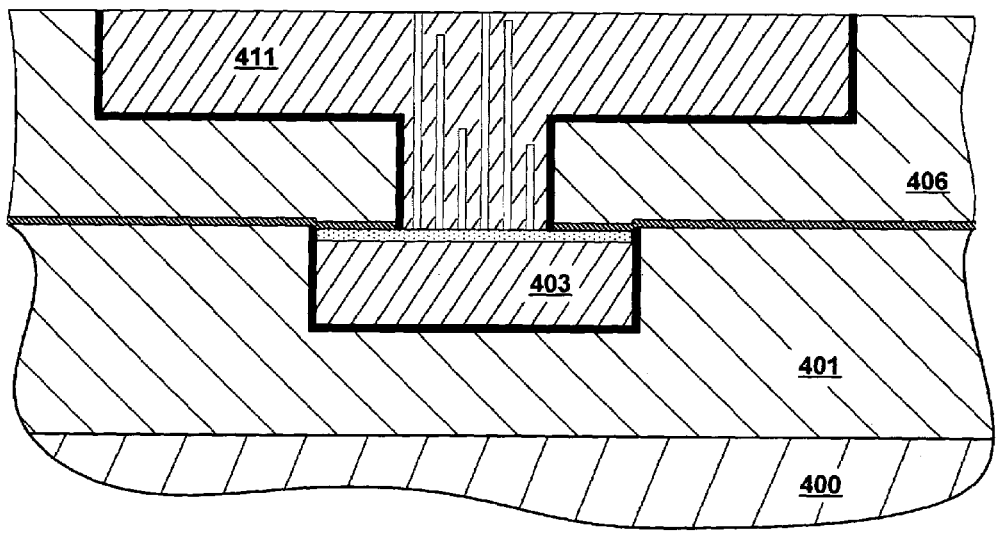

After filling the via voids, the upper surface of the chip assembly is subjected to chemical-mechanical polishing, to remove excess copper and to trim the excessively long carbon nanotubes (step 518). This polishing step removes material down to the top of dielectric layer 406, i.e., removes the copper 411 and liner 410 everywhere except in the previously formed trenches. FIG. 4G represents the chip assembly after polishing.

After filling the via voids with copper and polishing to trim the nanotubes, the via and conductive layer immediately above it are essentially complete. It is then possible to deposit further layers by beginning again at step 506.

Preferably, the chip is subjected to multiple double damascene processes to create multiple respective conductive layers and vias, and the process of creating any dielectric layer includes etching the layer to form both trenches and via cavities, which is followed by a single plating process which simultaneously fills the trenches and via cavities with copper. In the description above, steps 501–505 reflect a single damascene process, in which only the copper conductors in a conductive layer are formed. i.e., the formation of any vias below copper conductors 403 is not described. This description of process steps has been adopted for ease of understanding, since it is otherwise difficult to describe the origin of the via. In the preferred embodiment, all vias and trenches are created by double damascene processes, including the very first (or lowest) conductive layer above the level of the substrate and devices. However, it would alternatively be possible to create the lowest level vias by some other process.

A process of creating carbon nanotube and copper composite vias according to an alternative or second preferred embodiment is illustrated in the flow diagram of FIG. 7, and the cross-sectional illustrations of FIGS. 6A–6G. Because this process does not form a barrier completely enclosing the metal conductor, it is preferably used with some metal other than copper, such as aluminum. FIGS. 6A–6G depict a single conductor in conductive layer 602, it being understood that this is in fact a layer having a complex pattern of conductors, which are separated by dielectric.

Figure 6A:
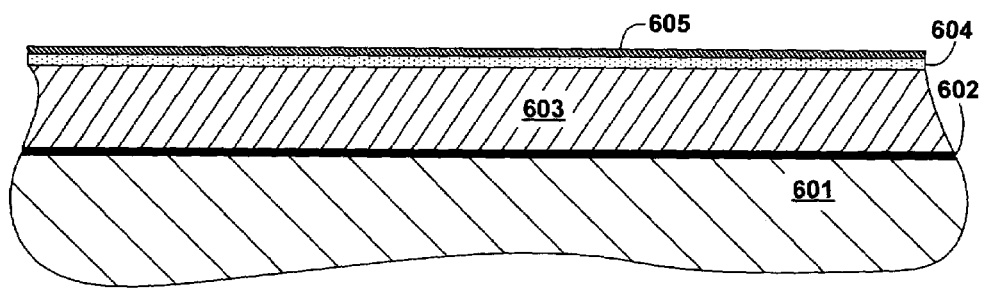
FIGS. 6A–6G are simplified enlarged cross-sectional views of a portion of an integrated circuit chip, showing the construction of a carbon nanotube and metal composite via at various stages, in accordance with an alternate preferred embodiment.
Figure 7:
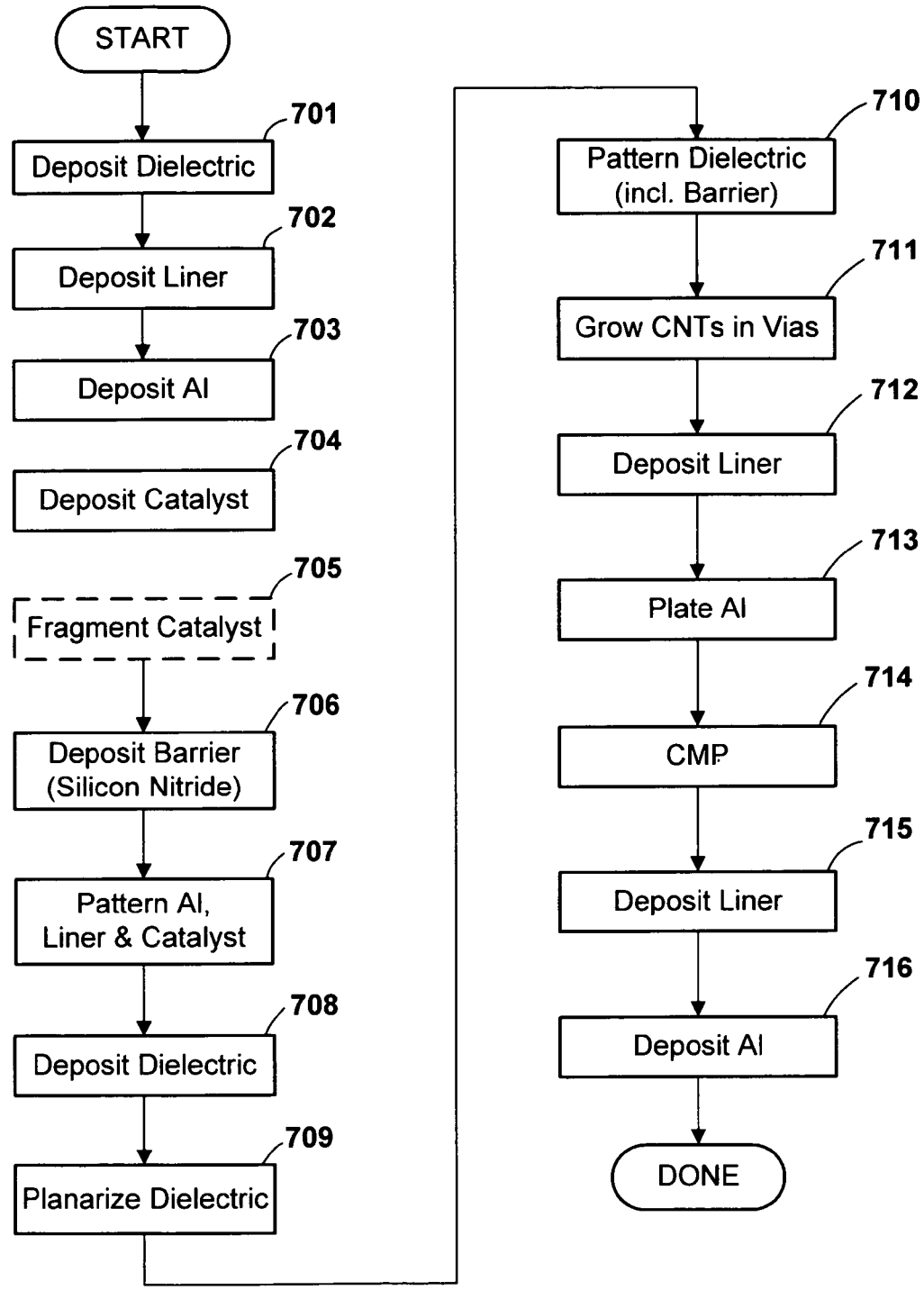
FIG. 7 is a flow diagram showing the overall process steps for forming a composite via, according to the alternate preferred embodiment.

This process begins from a conductive layer formed on a dielectric layer, illustrated in FIG. 6A. Dielectric layer 601 is initially deposited over a pre-existing layer, which could be a lower conductive layer or the substrate itself, using any conventional technique (step 701). A thin liner 602 is deposited over the dielectric layer (step 702). The liner preferably comprises a single layer of Ti, which may be deposited by atomic layer deposition or chemical vapor deposition. It functions primarily to improve adhesion, and not as a barrier to migration of the conductor. After deposition of the liner, a layer of a conductive metal 603, which is preferably aluminum 603, is deposited over the top surface by sputtering or any other suitable technique (step 703).

A layer of a suitable catalyst 604 for carbon nanotube growth is then deposited over the top surface of the aluminum (step 704). The catalyst may be any of Ni, Fe or Co, which may be deposited using atomic layer deposition or chemical vapor deposition. The catalyst may be fragmented by dilution or otherwise, as described above with respect to the first preferred embodiment. Such may involve an additional process step, shown in FIG. 7 as optional step 705.

A thin barrier layer 605 is then deposited over the top of the catalyst (step 706). The barrier comprises $Si_3N_4$, which is deposited by atomic layer deposition or chemical vapor deposition. The barrier prevents migration of certain catalysts, particularly Ni, into the dielectric. FIG. 6A illustrates a small portion of the chip assembly in cross section after step 706.

Figure 6B:
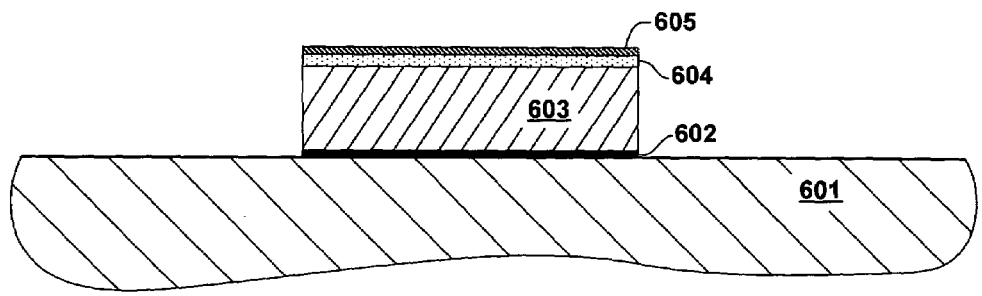

The aluminum 603 is then patterned as multiple individual conductors by lithographically patterning the top surface of the aluminum with a photo-resist mask; etching the unmasked portion of the aluminum; and removing the mask (step 707). The etching process necessarily removes the thin barrier 605 and catalyst 604 above the etched portion of the aluminum. It also removes the liner 602 from beneath the etched portion of the aluminum, etching all the way down to dielectric layer 601. FIG. 6B illustrates a small portion of the chip assembly after step 707, showing a single aluminum conductor in cross section.

Figure 6C:
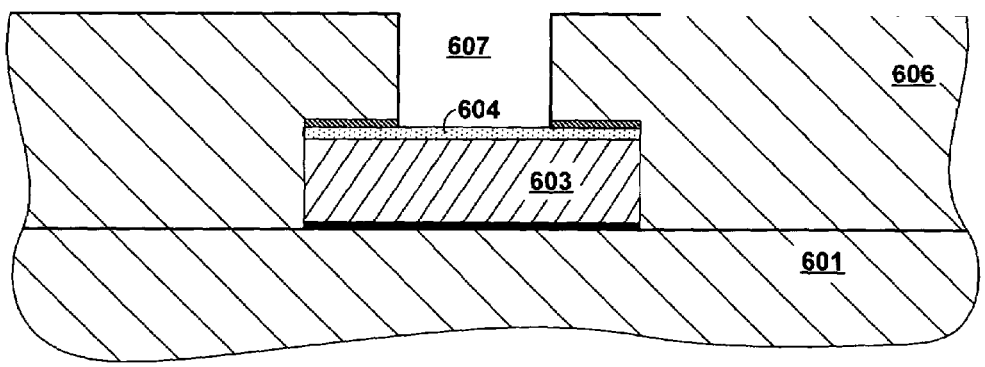

A second dielectric layer 606 having cavities 607 therein for respective vias is then formed over the top surface of the chip assembly, as represented in FIG. 6C. Preferably, the dielectric layer is a fluorosilicate glass low-k dielectric, although other materials might alternatively be used. The cavity can be formed according to any conventional process for forming a dielectric layer with a cavity therein, including any process hereafter developed. Preferably, the cavity is formed in a multi-stage process, in which the dielectric layer 606 is first deposited over the entire surface of the underlying layers (step 708); the dielectric layer so deposited is then planarized by chemical-mechanical polishing (step 709); the planarized dielectric layer is then patterned lithographically using a suitable photo-resist; selective portions of the dielectric layer are then etched to form cavities (step 710), according to the lithographic pattern; and the photo-resist is then removed from the remaining dielectric layer. The etching process also removes the barrier 605 to expose the catalyst. It will be understood that a large number of cavities (not shown in FIG. 6C) in the dielectric are formed simultaneously by this process. Preferably, the lithographic mask has holes for the vias approximately 200 nm square, which produces a round via hole approximately 200 nm in diameter. Via holes may be printed on a pitch of 400 nm or greater. FIG. 6C represents a small portion of the chip assembly, showing a via cavity in cross section, after step 710.

Figure 6D:
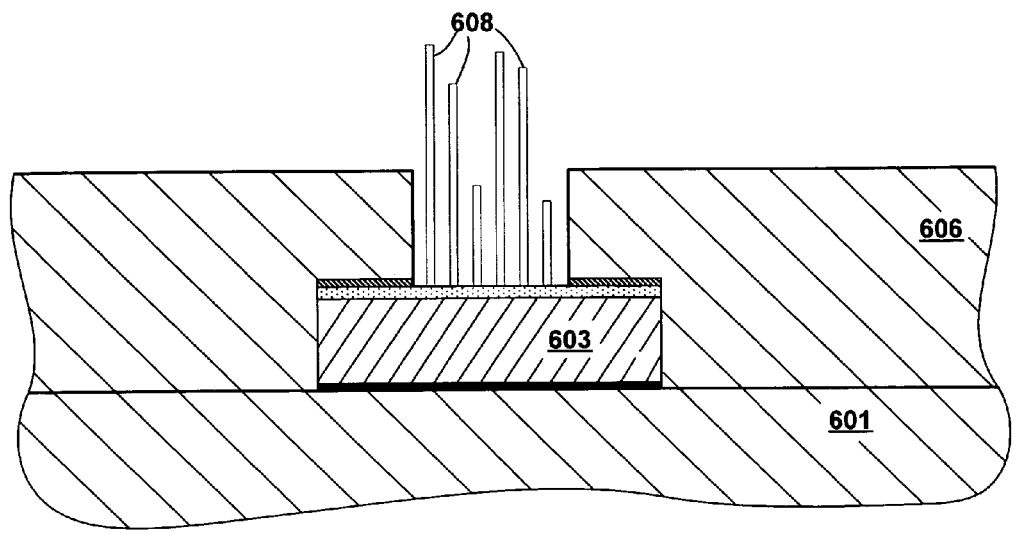

Carbon nanotubes 608 are then grown in the via cavity from the exposed catalyst area (step 711). Preferably, carbon nanotubes are grown under the same process conditions stated above with respect to the first preferred embodiment. As in the case of the first preferred embodiment, it is expected that a heterogeneous collection of carbon nanotubes will be produced, varying in diameter, length, deposition density, and electrical conductivity, and that only some of these will be useful. FIG. 6D represents a via cavity in cross section, after growing the carbon nanotubes, it being understood that the carbon nanotubes (and other features) are not necessarily represented in true number and scale.

Figure 6E:
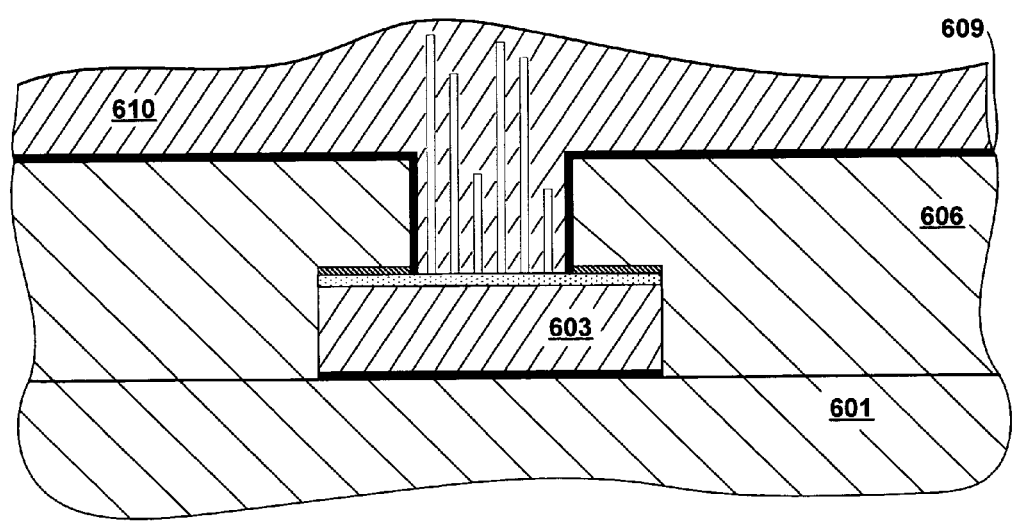

As explained previously with respect to the first preferred embodiment, the carbon nanotubes are long, thin members growing substantially parallel, which do not fill the entire volume of the via cavity, leaving void between the tubes. After the carbon nanotubes have been formed in the via cavity as described above, these voids between the carbon nanotubes are filled with aluminum. To fill the voids with aluminum, a liner 609 is first deposited in the via and over the dielectric (step 712). Preferably, the liner a thin layer of Ti, followed by a seed layer of Al. The liner layers are deposited using atomic layer deposition by chemical vapor deposition. After deposition of the liner, the via is filled with aluminum 610 by plating (step 713). Alternatively, the via may be filled by chemical vapor deposition or physical vapor deposition. FIG. 6E represents the via after an aluminum plating process which fills the voids in the via cavity and plates the surface of the dielectric with an aluminum layer 610. It will be observed that, because some nanotubes extend out of the via cavity, the plating surface may be uneven, and exhibit bumps in the vicinity of the vias.

Figure 6F:
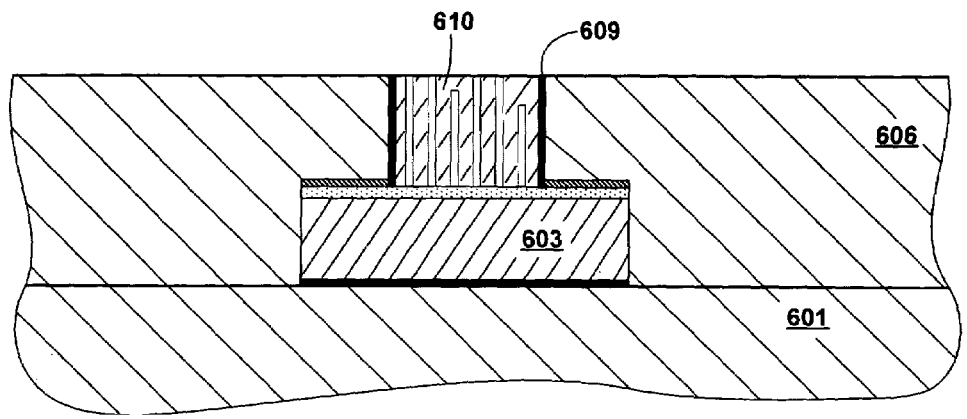

After filling the via voids, the upper surface of the chip assembly is subjected to chemical-mechanical polishing, to form a smooth planar surface and to trim the excessively long carbon nanotubes (step 714). Preferably, this polishing step removes the entire metal layer over the dielectric that was created when plating the via holes. Alternatively, it may remove only a portion of the plated metal layer, leaving the remaining portion as part of the next conductive layer over dielectric layer 606. FIG. 6F represents the via after polishing; in the example of FIG. 6, the entire residual metal layer has been removed, it being understood that some part of the layer could have been left intact in an alternative embodiment.

Figure 6G:
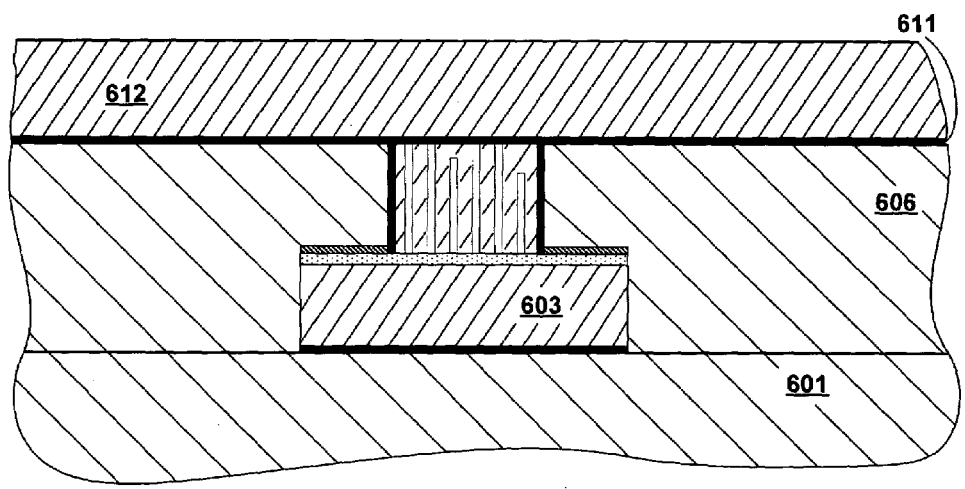

After filling the via voids with aluminum and polishing to trim the nanotubes, the via is essentially complete. It is then possible to deposit the next conductive layer over dielectric layer 606. If the entire residual deposited metal was removed in the polishing step, a liner of Ti 611 should first be deposited on the dielectric (step 715). This is followed by aluminum deposition, using any conventional process (step 716). FIG. 6G represents the via after depositing conductive layer 612 over the dielectric layer. When patterned, conductive layer 612 will have a conductor at the location where the via emerges from dielectric layer 606.

Ideally, whether the first or second process described above or some other process is used, all of the voids between the carbon nanotubes in a via are completely filled with metal, as is represented in FIGS. 4F–4G and 6E–6G. However, it may be difficult to obtain perfect results, and it will be recognized that even partial filling of the voids can provide substantial benefit in terms of increased contact area between the carbon nanotubes and the conductive layers. Process parameters which make some compromise between complete filling of the voids and some other desired goal may produce perfectly acceptable results. Therefore, although complete filling of the voids is represented herein as the ideal, the present invention is not limited to techniques which assure complete filling of the voids.

In the preferred embodiment, the conductors in the conductive layer and in the voids between the carbon nanotubes in the via are filled with copper, or alternatively, aluminum. However, it will be recognized that other conductive metals may alternatively be used. For example, tungsten and other conductive metals, including metal alloys, are also possible. Furthermore, while it is preferred that the metal used in the conductive layer be the same as the metal used in the via voids, one could alternatively use different materials. As a further alternative, it may be possible to construct conductors in the conductive layer using a composite of carbon nanotubes and a metal, such as copper.

Various dimensions, materials, process parameters and so forth have been given herein as representative or preferred values using available technology. However, it will be appreciated that as technological capabilities advance, new techniques for performing various processes or constructing integrated circuit components may be developed, and specifically new techniques for creating and manipulating carbon nanotubes may be developed. The representative techniques described herein are not intended to limit the present invention to any particular dimension, material, or process parameter.

An integrated circuit module has been shown and described in the preferred embodiment herein as a component of a digital computer system. However, as is well known, integrated circuit modules are used in a variety of digital devices. An integrated circuit chip in accordance with the present invention could be used in any digital device, whether or not such device is called a "computer system". A few examples of such devices include: limited function digital devices such as personal digital assistants, cell phones, digital cameras, controllers for buildings, automobiles and other machinery, robotic systems, and cell phones. However, as is well known, integrated circuit chips are being incorporated into an ever more devices, and the above enumeration should not be considered a complete enumeration or limitation on the types of devices which might use integrated circuit chips.

Although a specific embodiment of the invention has been disclosed along with certain alternatives, it will be recognized by those skilled in the art that additional variations in form and detail may be made within the scope of the following claims:

What is claimed is:

1. An integrated circuit chip, comprising:
   a plurality of active devices formed on a substrate;
   a plurality of electrical conductors in one or more conductive layers for providing electrical connections to said plurality of active devices, each said electrical conductor lying in a respective conductive layer of said one or more conductive layers and forming a respective portion of a respective electrical logic circuit path to one or more said plurality of active devices; and
   a plurality of electrically conductive vias, each via electrically connecting a respective first electrical conductor of said plurality of electrical conductors in a respective first conductive layer with at least one of the set consisting of: (a) a respective second electrical conductor of said plurality of electrical conductors in a respective second conductive layer, each said respective second conductive layer being separated from the respective first conductive layer by a dielectric layer, and (b) a respective active device of said plurality of active devices formed on said substrate, said plurality of active devices being separated from the respective first conductive layer by a dielectric layer, each said electrically conductive via forming a respective portion of a respective electrical logic circuit path to one more said plurality of active devices;
   wherein each said conductive via comprises a plurality of carbon nanotubes embedded in an electrically conductive metal, said plurality of carbon nanotubes being surrounded by and embedded in said electrically conductive metal throughout the length of the via.

2. The integrated circuit chip of claim 1, wherein said plurality of carbon nanotubes are oriented substantially perpendicular to said first conductive layer.

3. The integrated circuit chip of claim 1, wherein said electric ally conductive metal is copper.

4. The integrated circuit chip of claim 1, wherein each said conductive via further comprises a catalyst formed on at least one of (a) a conductor and (b) an active device, said plurality of carbon nanotubes within said conductive via being grown from said catalyst.

5. The integrated circuit chip of claim 4, wherein said catalyst comprises at least one of the set consisting of nickel, iron and cobalt.

6. The integrated circuit chip of claim 4, wherein said catalyst comprises a composite of a catalytic metal and a non-catalytic metal.

7. The integrated circuit chip of claim 4, wherein said catalyst is fragmented to reduce the density of carbon nanotube formation.

8. The integrated circuit chip of claim 1, wherein said integrated circuit chip is a processor chip containing at least one central processing unit for a digital computing device.

9. The integrated circuit chip of claim 1, wherein each said conductive via is formed within a respective cavity in said dielectric layer, said plurality of carbon nanotubes and electrically conductive metal substantially filling the cavity.

10. An integrated circuit chip, comprising:
    a plurality of active devices; and
    a plurality of electrical conductors for providing electrical connections to said plurality of active devices, each said electrical conductor forming a respective portion of a respective electrical logic circuit path to one or more said plurality of active devices, wherein at least some of said electrical conductors comprise a composite of a plurality of elongated carbon nanotubes and an electrically conductive metal, said plurality of carbon nanotubes being surrounded by and embedded in said electrically conductive metal substantially throughout their respective lengths, said elongated carbon nanotubes being oriented in their respective longitudinal axes substantially parallel to the direction of electrical current flow through the electrical conductor in which each respective carbon nanotube resides.

11. The integrated circuit chip of claim 10, wherein said electrically conductive metal is copper.

12. The integrated circuit chip of claim 11, wherein at least some of said electrical conductors comprising a composite of a plurality of elongated carbon nanotubes and an electrically conductive metal are conductors running between layers in said integrated circuit chip.

13. The integrated circuit chip of claim 10, wherein each said electrical conductor further comprises a catalyst formed on at least one of (a) a conductor and (b) an active device, said plurality of carbon nanotubes within said electrical conductor being grown from said catalyst.

14. The integrated circuit chip of claim 13, wherein said catalyst comprises at least one of the set consisting of nickel, iron and cobalt.

15. The integrated circuit chip of claim 13, wherein said catalyst comprises a composite of a catalytic metal and a non-catalytic metal.

16. The integrated circuit chip of claim 13, wherein said catalyst is fragmented to reduce the density of carbon nanotube formation.

17. The integrated circuit chip of claim 10, wherein each said electrical conductor formed within a respective cavity in a dielectric layer of said integrated circuit chip, said plurality of carbon nanotubes and electrically conductive metal substantially filling the cavity.

* * * * *